United States Patent
Kim (10) Patent No.: US 6,829,365 B1
(45) Date of Patent: Dec. 7, 2004

(54) MP-3 PLAYER

(75) Inventor: Cheon-Kuk Kim, Suwon (KR)

(73) Assignee: I & C Co., Ltd., Seoul (KR)

( * ) Notice: Subject to any disclaimer, the term of this patent is extended or adjusted under 35 U.S.C. 154(b) by 0 days.

(21) Appl. No.: 10/181,599

(22) PCT Filed: Mar. 17, 2000

(86) PCT No.: PCT/KR00/00235

§ 371 (c)(1),
(2), (4) Date: Jul. 18, 2002

(87) PCT Pub. No.: WO01/54131

PCT Pub. Date: Jul. 26, 2001

(30) Foreign Application Priority Data

Jan. 18, 2000 (KR) ........................................ 2000/01285

(51) Int. Cl.[7] ............................................. H04R 25/00
(52) U.S. Cl. ....................... 381/370; 381/182; 381/378; 455/556
(58) Field of Search ................................ 381/182, 300, 381/309, 311, 312, 370, 371, 374, 377, 378, 384; 379/430; 455/90, 556, 568

(56) References Cited

U.S. PATENT DOCUMENTS 4,654,883 A    3/1987  Iwata
6,466,677 B1 * 10/2002  Bush .......................... 381/300

* cited by examiner

Primary Examiner—Suhan Ni
(74) Attorney, Agent, or Firm—Dann, Dorfman, Herrell and Skillman, P.C.

(57) ABSTRACT

An MP-3 player includes a first speaker portion in which a speaker is mounted so as to be positioned at an ear of a user, an electric device portion which is mounted in the first speaker portion and provided with electric parts for reproducing sounds from an MP-3 file, a second speaker portion in which a speaker is mounted so as to be positioned at the other ear of the user; and a wearing means for connecting the first speaker portion and second speaker portion which is worn on the user's head. The speaker portions and the main body are integrally formed into a headphone or back-phone arrangement, thereby minimizing the size of the MP-3 player. Further, a separate wire is not needed in the MP-3 player, thereby reducing the trouble such as a short of the wire.

9 Claims, 10 Drawing Sheets

Fig. 1

PRIOR ART

MP-3 PLAYER

BACKGROUND OF THE INVENTION

1. Field of the Invention

The present invention relates to a MP-3 player, and more particularly, a MP-3 player which is integrally provided with a speaker and a body of the MP-3 player, thereby being directly applied to a user's head portion as a headphone.

2. Description of the Related Art

Recently, there are many kinds of portable sound reproducing apparatuses such as a portable cassette player and a portable compact disk player which provides better sound quality than the cassette player. However, in case of the compact disk player, since a comparative large sized disk is loaded to the compact disk player, the compact disk player has a considerable size. And, since the compact disk player is sensitive to vibration and impact from the outside, it is inconvenient that a user should be careful in handling the compact disk player. Further, there is a disadvantage in the compact disk player that many disks are needed in order to listen to various kinds of music.

In order to solve the above problems of the compact disk player, there has been proposed a portable MP-3 player which downloads a digitalized MP-3 file through a PC communication or a computer network and reproduces a sound.

The MP-3 player is a sound recording/reproducing apparatus in which a digitalized sound signal is stored in a memory and the sound signal is then converted into an analog signal signal and reproduced through a speaker. Meanwhile, since the MP-3 player uses a memory chip which is smaller and lighter than the conventional disk, the size and weight of the MP-3 player itself can be remarkably reduced. Further, the MP-3 player can provides a good sound quality equal to the compact disk player.

Figure 1:
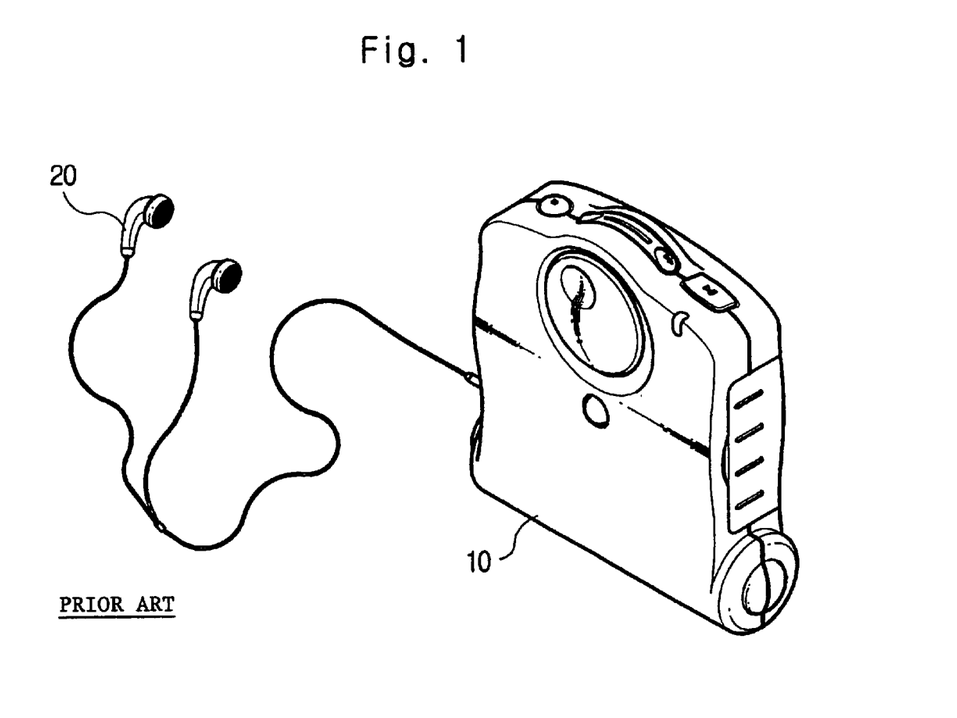
FIG. 1 is a perspective view showing a conventional MP-3 player.

As shown in FIG. 1, the conventional MP-3 player comprises a body 10 which treats a digital signal and an earphone 20, headphone or back-phone which is connected with the body 10 and transfers a sound to the outside. Here, the back-phone is defined as a headphone of which a headband is adapted to be located on a back portion of a user's head when the user wear the headphone.

And when using the MP-3 player, the earphone 20, headphone or back-phone is worn on a head portion of a user, the body 10 is received in a pocket or bag of the user.

However, the conventional MP-3 player has a wire to connect the speaker portion with the body 10. The wire is extended along the user's body form the speaker portion to the body 10. Therefore, the wire restricts the user's action.

SUMMARY OF THE INVENTION

It is therefore an object of the present invention to provide a MP-3 player which is integrally provided with a speaker and a body of the MP-3 player, thereby providing a convenience for a user.

To achieve the above objects and other advantages, there is provided a MP-3 player comprising a first speaker portion in which a speaker is mounted and which is positioned at an ear of a user, an electric device portion which is mounted in the first speaker portion and provided with electric parts for reproducing a sound source of a MP-3 file, a second speaker portion in which a speaker is mounted and which is positioned at the other ear of the user; and a wearing means for connecting the first speaker portion and the second speaker portion, which is worn on the user's head portion.

It is preferable that the first speaker portion comprises a first housing in which a battery receiving portion is formed, a second housing which is coupled to a face of the first housing and in which the electric device portion is provided, and a third housing which is coupled to a face of the second housing and in which the speaker is mounted.

Further, it is preferable that the first speaker portion further comprises a cover which opens/closes the battery receiving portion of the first housing, and the electric device portion is formed with a memory card supporting member, and an entrance of the memory card supporting member is formed in an inner portion of the battery receiving portion.

Preferably, the third housing is provided a protrusion which is projected toward the second housing and of which an end is a hook shaped portion, and the second housing has a slot to which the protrusion is fitted, wherein the slot comprises a inserting portion through which a protrusion of the third housing is inserted, and a coupling portion which is extended from the inserting portion and has narrower width than that of the inserting portion so that the hook shaped portion is latched to the coupling portion.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown.

Figure 2:
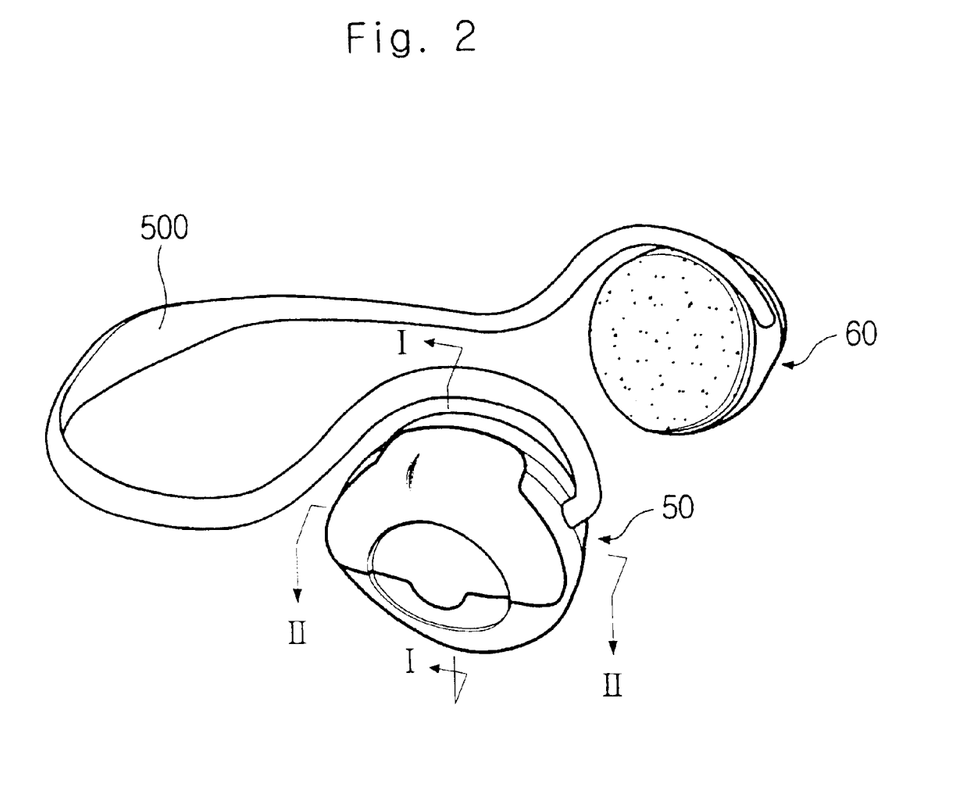
FIG. 2 is a perspective view showing a MP-3 player according to the present invention.
Figure 3:
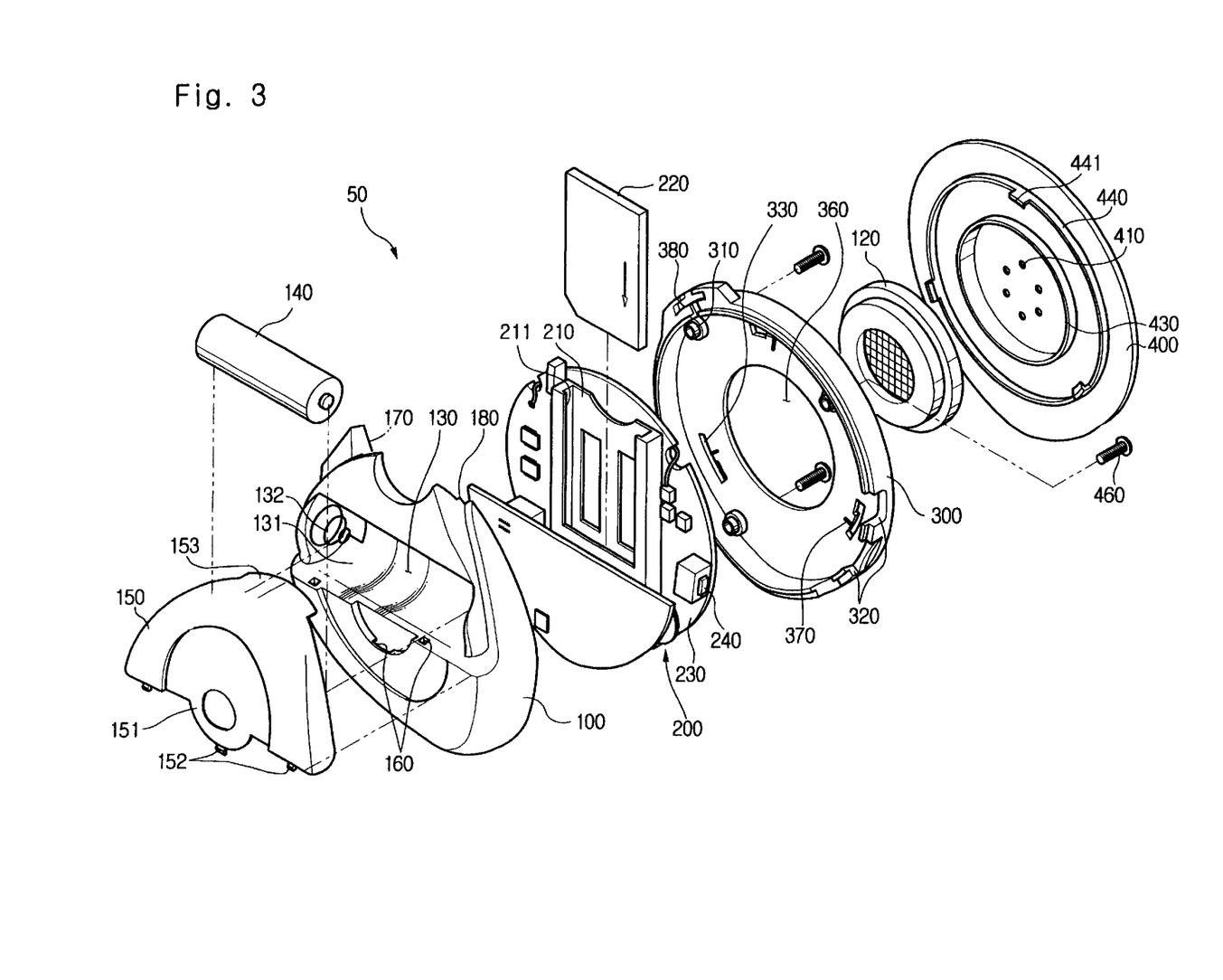
FIG. 3 is an exploded perspective view showing the MP-3 player according to the present invention.

As shown in FIG. 2 and 3, a MP-3 player according to the present invention is formed into a back-phone type. The MP-3 player comprises first speaker portion 50 in which a speaker 120 is mounted and which is worn about an ear of a user, a second speaker portion 60 which is worn about the other rear of the user and a wearing means for connecting the first speaker portion 50 and the second speaker portion 60. Preferably, the wearing means is a headband 500. An electric device portion 200 of the MP-3 player is formed within the first speaker portion 50.

Figure 4:
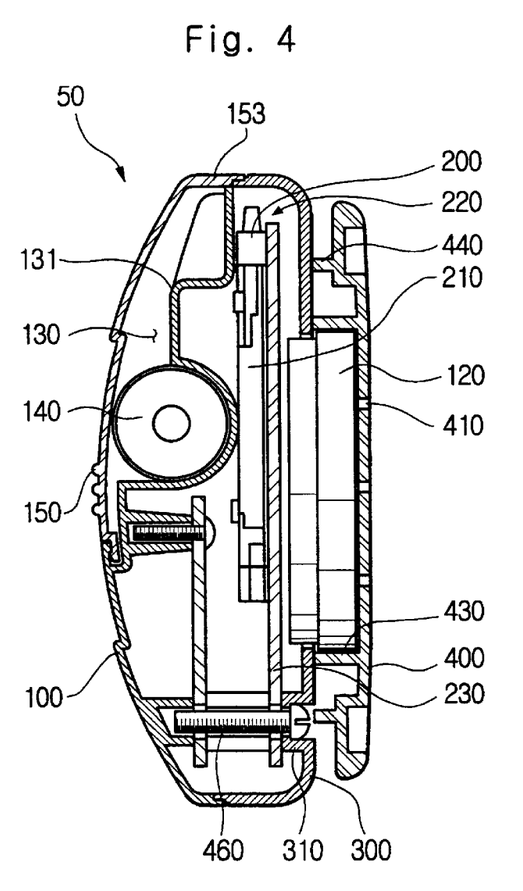
FIG. 4 is a cross-sectional view taken along a line I—I in FIG. 2.
Figure 5:
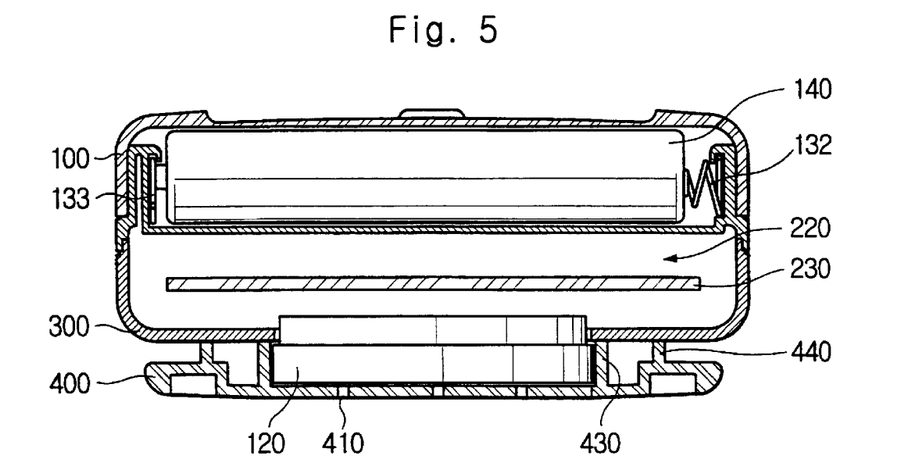
FIG. 5 is a cross-sectional view taken along a line II—II in FIG. 2.

As shown in FIGS. 3, 4 and 5, the first speaker portion 50 comprises a first housing 100 which forms a most outer portion, a second housing 300 which is mounted on an inner side of the first housing 100 and a third housing 400 which is mounted on an inner side of the second housing 300.

In FIGS. 3, 4, 5 and 6a, the first housing 100 is formed with a battery receiving portion 130 for receiving a battery 140 as a power source. The battery receiving portion 130 is opened/closed by a cover 150.

Figure 6A:
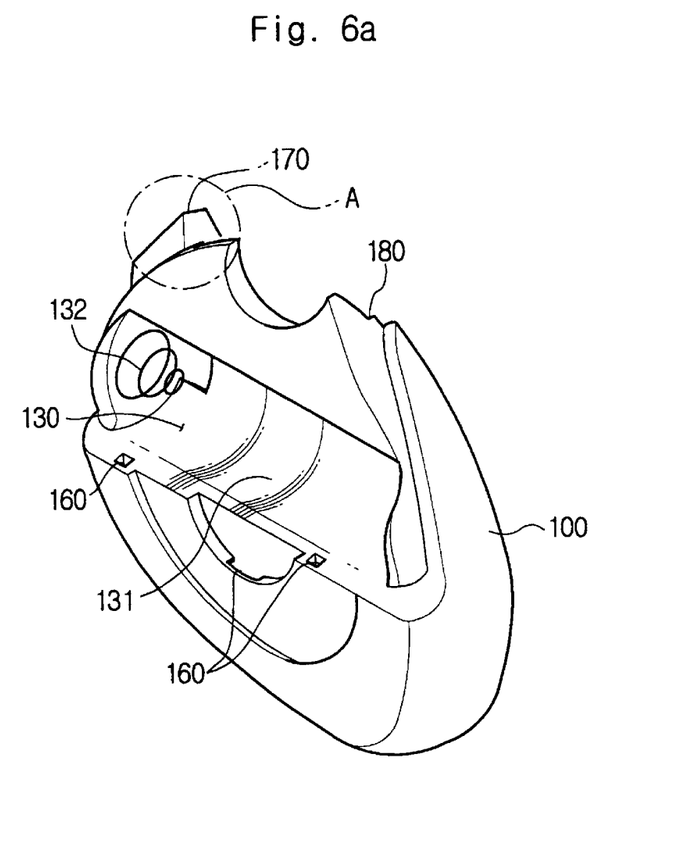
FIG. 6A is a perspective view showing a first housing of the MP-3 player according to the present invention.

The battery receiving portion 130 is formed with a curved portion 131 in which the battery 140 is mounted, and a coil 132 which is served as a negative pole and a plate 133 which is served as a positive pole. The cover 150 is formed with a hook button 151 and a hook 152 at a center portion of a lower end thereof to be coupled to the first housing 100. The hook 152 is also formed at both side of the lower end of the cover 150. In addition, a plurality of hook grooves 160 are respectively formed at each portion of the housing 100 corresponding to the hooks 152.

Figure 6B:
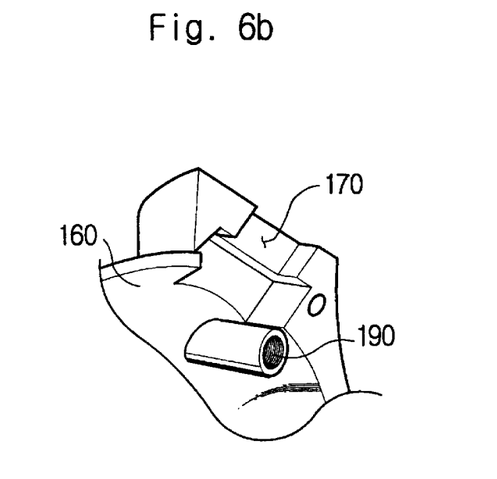
FIG. 6B is an enlarged perspective view showing a part A of FIG. 6A.

At a center portion of an upper end of the first housing 100, which is inclined about 45 degrees to a left side as shown in FIG. 6b, there is provided a first fitting groove 170 for fixing the headband 500. The first fitting groove 170 has an entrance which is narrower than a fitting portion in which an end of the head band 500 is fixed.

In addition, at the center portion of the upper end of the first housing 100, there is formed a memory card receiving portion 180 for receiving a memory card 220. The memory card receiving portion 180 is opened/closed by a extending portion 153 of the cover 150 which is extended to the first housing 100. Therefore, the memory card receiving portion 180 and the battery receiving portion 130 are simultaneously opened/closed by the cover 150. Further, a screwing hole 190 is provided on the first housing 100 so as to be coupled together with a second housing 300 by a screw 460.

As shown in FIGS. 3, 4, 5 and 7, the second housing 300 is formed into a disk type. At an upper portion of the second housing 300, there is provided a second fitting groove 380 corresponding the first fitting groove 170 of the first housing 100. The electric device portion 200 is formed between the first and second housings 100 and 300.

Figure 7:
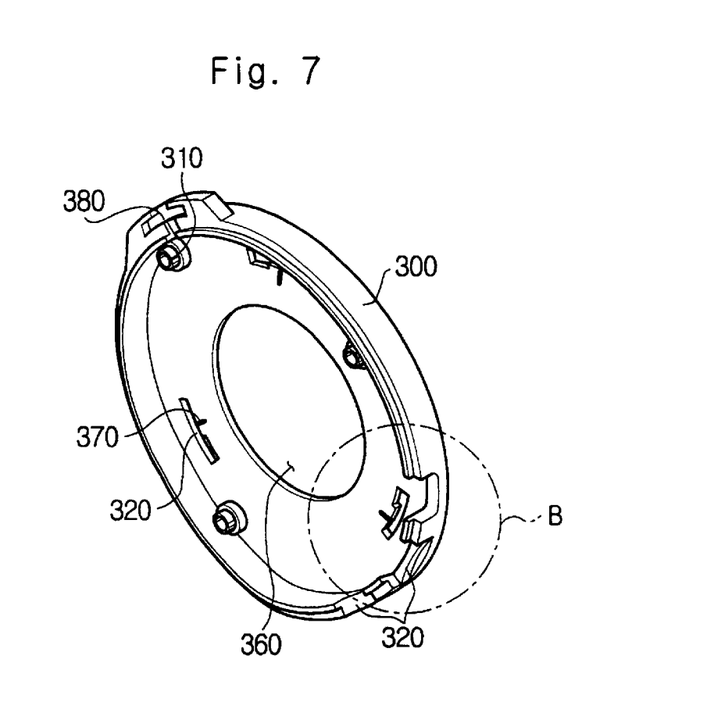
FIG. 7 is a perspective view showing a second hosing of the MP-3 player according to the present invention.

The electric device portion 200 has a printed circuit board 230 on which a circuit and devices for treating and reproducing a signal of a MP-3 file is mounted and with which a memory card supporting member 210 is connected. The printed circuit board 230 is screwed to the curved portion 131 of the first housing 100.

Here, the memory card supporting member 210 is formed with a receiving space for receiving the memory card 220 and a sliding groove 211 for guiding the memory card 220 which is inserted into the receiving space. The memory card supporting member 210 is made of a plastic material. The printed circuit board 230 is connected to a lower end of the memory card supporting member 210. At an outside of the printed circuit board 230, there are provided a plurality of switches 240 for controlling an operation of the electric device portion 200.

Meanwhile, on a surface of the second housing 300, there are provided a plurality of screwing bosses 310 so that the second housing 300 is screwed to the first housing 100. At a circumferential face of the second housing 300, there is an mounting groove 320 in which the switches 240 are positioned.

Slots 330 are formed at an inner face of the second housing 300 so that the third housing 400 is coupled to the second housing 300 through the slots 330. A speaker installing hole 360 is formed in a center portion of the second housing 300. A speaker 120, which is interposed between the second housing 300 and the third housing 400, is inserted and fixed in the speaker hole 360.

Figure 8:
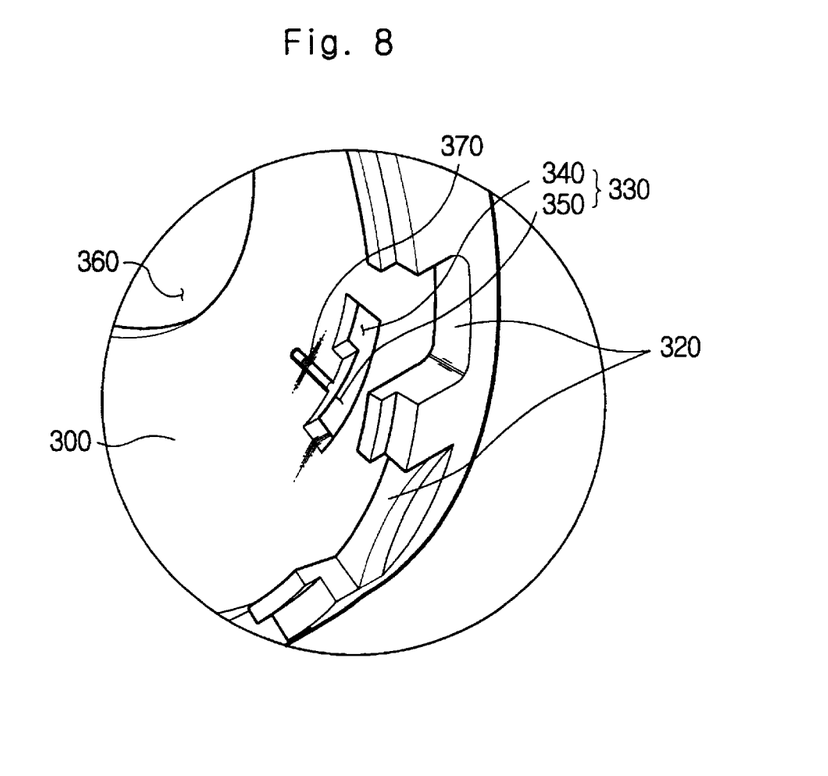
FIG. 8 is an enlarged perspective view showing a part B of FIG. 7.

As shown in FIG. 8, each of the slots 330 is formed with a inserting portion 340 through which a protrusion 441 of the third housing 400 is inserted, and a coupling portion 350 which has narrower width than that of the inserting portion 340. Therefore, after the protrusion 441 is inserted into the inserting portion 340, if the protrusion 441 is rotated toward the coupling portion 350, the end of the protrusion 441 is coupled to the coupling portion 350.

In addition, at the inner face of the second housing 300, there is formed a stepped portion 370 which is positioned between the inserting portion 340 and the coupling portion 350. The stepped portion 370 prevents the protrusion 441 from being moved to the inserting portion 340 of the slot 330 due to an impact from the outside. Therefore, the third housing 400 can be stably fixed to the second housing 300.

Figure 9:
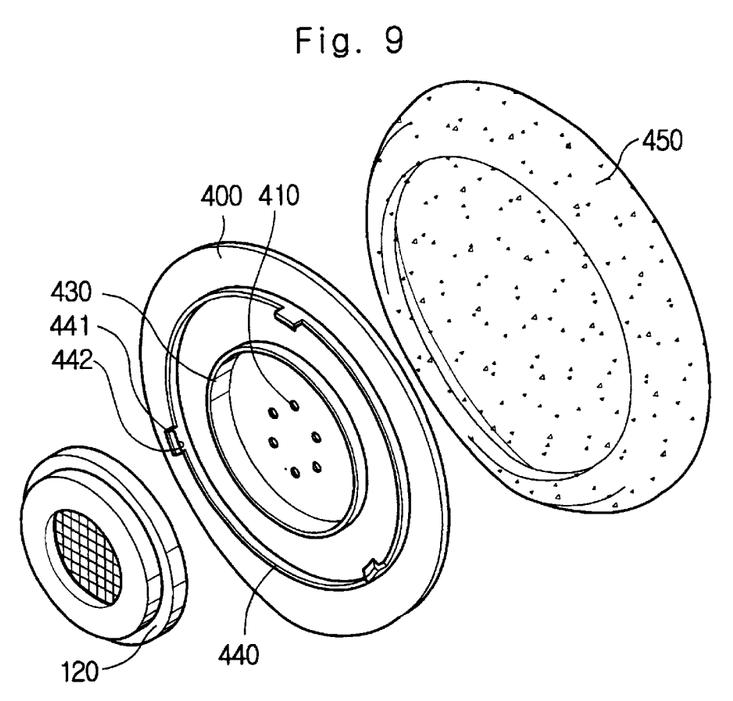
FIG. 9 is a perspective view showing a third housing of the MP-3 player according to the present invention.

As shown in FIG. 9, the third housing 400 has a disk shape, and is formed with a plurality of speaker holes 410 at the center thereof and a first circular rib 430 around the speaker holes 410.

At an outer side of the first circular rib 430, there is provided a second circular rib 440 from which the protrusions 441 are projected. The second rib 440 adapts the protrusions 441 to being coupled to the slots 330, when the third housing 400 is coupled to the second housing 300. Further, the end of the protrusion 441 has a hook shaped portion 442 of which one side portion is projected to the outside.

The speaker 120 has a stepped body so as to be inserted into the first circular rib 430 and is electrically connected with the printed circuit board 230. The third housing 400 is covered by a speaker cushion 450.

Figure 10:
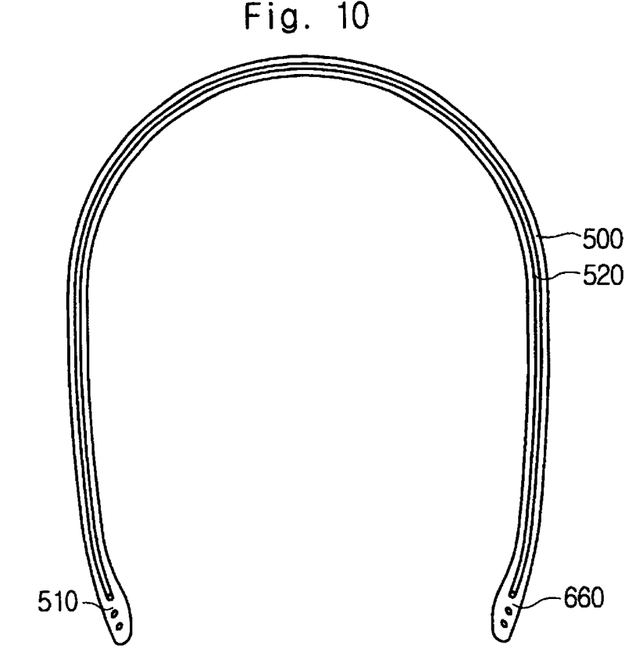
FIG. 10 is a plan view showing a headband for the MP-3 player according to the present invention.
Figure 11:
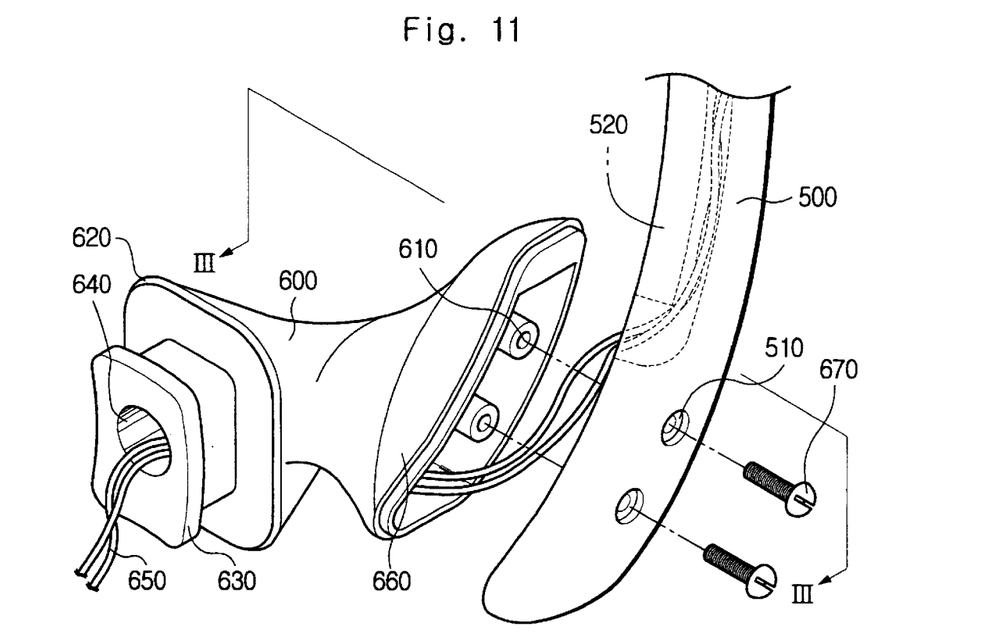
FIG. 11 is an enlarged perspective view of the headband and a connecting member.
Figure 12:
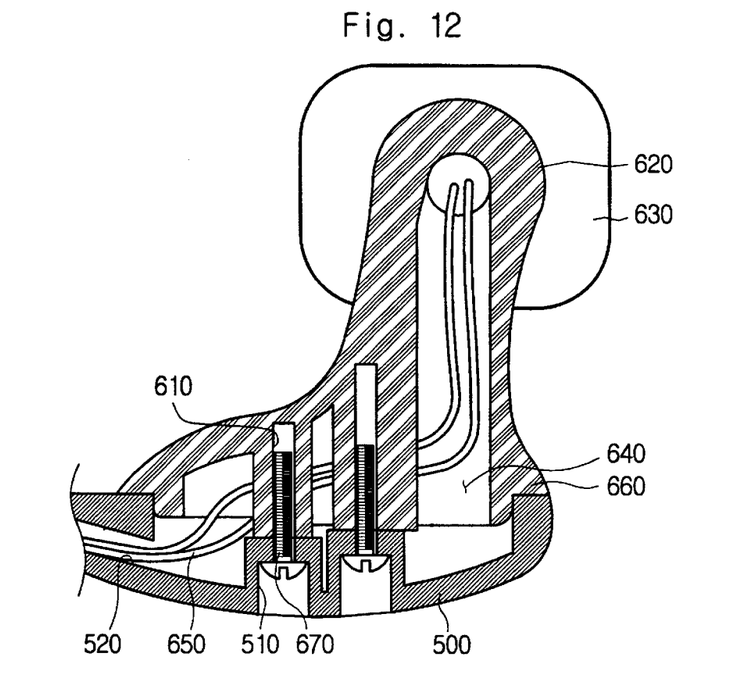
FIG. 12 is a cross-sectional view showing a state that the headband and the connecting member are coupled.

As shown in FIGS. 10, 11 and 12, both ends of the headband 500 are bent so as to be latched on a user's ear. And on each end of the headband 500, there is mounted a connecting member 600 which connects the headband 500 with the first and second speaker portion 50, 60.

In order to couple the headband 500 and the connecting member 600, two screwing holes 510 are formed at each end of the headband 500. The connecting member 500 is also formed with screwing holes 610 corresponding to the screwing holes 510 of the headband 500 so as to be screwed on the headband 500 by a separate screw 670.

The connecting member 600 is provided with a band connecting portion 660 which is coupled to the headband 500 and a housing connecting portion 620 which is inserted into the speaker portion 50, 60 of the housing 100, 300.

The band connecting portion 660 is formed with the screwing holes 610. The housing connecting portion 620 is integrally formed with a fitting plate 630 which is fitted between the fitting grooves 170, 380 respectively formed in the first and second housings 100, 300. Further, a through hole 640 is formed in each inner portion of the first and second housings 100, 300 so that a wire 650 is passed through the through hole 640. The wire 650 is extended from the first speaker portion 50 to the second speaker portion 60 so that the first and second speaker portions 50, 60 are electrically connected each other. In order for the wire 650 to be stably positioned, a guiding groove 520 is formed at an outer circumference of the headband 500. The guiding groove 520 is extended from the first speaker portion 50 to the second speaker portion 60.

Figure 14:
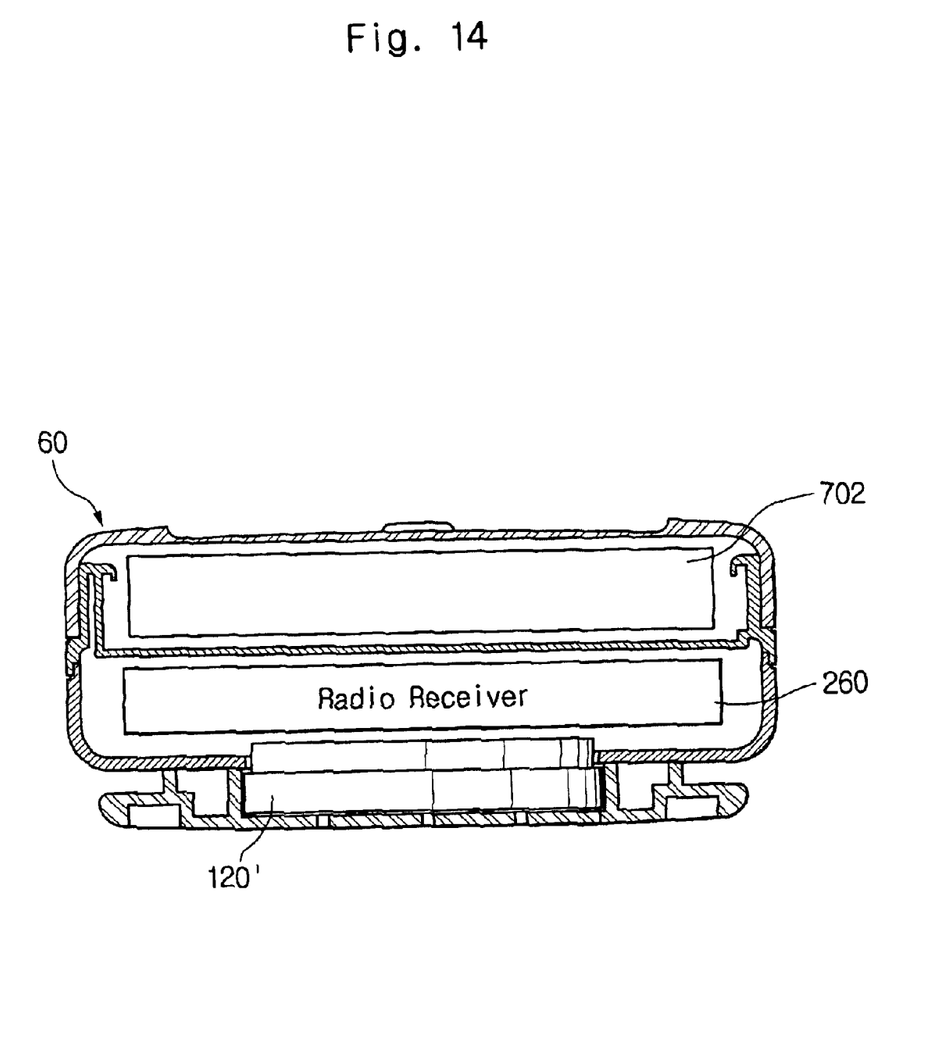
FIG. 14 is a cross-sectional view of a second speaker portion that includes a radio module.

Meanwhile, the second speaker portion 60 has only the speaker 120' at the inside thereof. However, according to the present invention, the second speaker portion 60 may be modified to have a radio receiver 260 as shown in FIG. 14. The radio receiver is disposed at an inner portion of the housing to receive a radio wave. A power source receiving portion 702 and a switch portion (not shown) are also provided in the housing. Therefore, the structure is almost similar to the first speaker portion 50.

Hereinafter, an operation and an assembling process of the MP-3 player according to the present invention will be described more fully.

First, in the assembling process of the first speaker portion 50, the printed circuit board 230 is mounted between the first housing 100 and the second housing 300. At this time, the memory card supporting member 210 is placed at an upper side of the memory card supporting member 210. And the various switches 240 is placed at the mounting groove 320 of the second housing 300. The screw 460 is inserted through the screwing boss 310 of the second housing 300 into the screwing hole 190 of the first housing 100.

When the first housing 100 is coupled to the second housing 300, the headband 500 is also fixedly mounted to the fitting groove 170, 380. First, the connecting member 600 is fixedly mounted at the end of the headband 500 by the screw 670. Simultaneously, the wire 650 is installed through the through hole of the connecting member 600. Then, after the end of the headband 500 is fitted to the fitting groove 170, 380 of the first and second housings 100, 300, the first and second housing 100, 300 are fixed each other by the screw.

Sequentially, the third housing 400 is coupled to the outer face of the second housing 200. At this time, after the protrusions 441 formed on the second circular rib 440 of the third housing 400 are inserted into each inserting portion 340 of the slots 330 which are formed on the surface of second housing 300, if the protrusion 441 is rotated toward the coupling portion 350 of the slot 330, the hook portion 442 formed on the end of the protrusion 441 is passed over the stepped portion 370 which is formed on the inner face of the second housing 300, whereby the protrusion 441 is fixedly positioned in the coupling portion 350.

Meanwhile, before coupling the third housing 400, the speaker 120 is mounted at the first rib 430 of the third housing 400. And the third housing 400 is then coupled to the second housing 300.

In the operation of receiving the battery 140 in the battery receiving portion 130, first of all, the cover 150 mounted on the first housing 100 is removed. The battery 140 is settled in the battery receiving portion 140. The memory card 220, in which the MP-3 files are stored, is inserted into the memory card receiving portion 180 formed on the upper portion of the battery receiving portion 130. Then, the cover 150 is coupled to the first housing 100, again.

The second speaker portion 60 is assembled in the same manner as in the first speaker portion 50. Moreover, if the second speaker portion 60 is provided with the radio receiver, the assembling process of the second speaker portion 60 is further similar to that of the first speaker portion 50.

In the state that the assembling process is completed, after the user wears the MP-3 player on his ear like a conventional head phone or back-phone, the user operates the switches 240, whereby the MP-3 player is operated. According to the operation of the switches 240, a sound source stored in the memory card 220 is output from a digital signal treating unit and continuously converted into an analog signal and then output through the speaker 120.

When the user would like to listen to the radio, the user should switch off the MP-3 player in the first speaker portion 50, and switch on the radio operating switch.

Meanwhile, in the aforementioned MP-3 player, there is not provided an operational displaying unit. Therefore, in order to make up for this weak point, a separate portable displaying unit may be provided. Also, the portable displaying unit may be provided in a wire or wireless type.

Further, according to the present invention, the coupling structure between the second and third housings 300, 400 may be modified to be capable of being freely separated each other. Therefore, when the second housing 300 is separated from the third housing 400, the MP-3 player can be served as a wire or wireless headphone. When reproducing the sound source of the MP-3, the second housing 300 is coupled to the third housing 400, whereby the functions of the MP-3 player may be improved.

Figure 13:
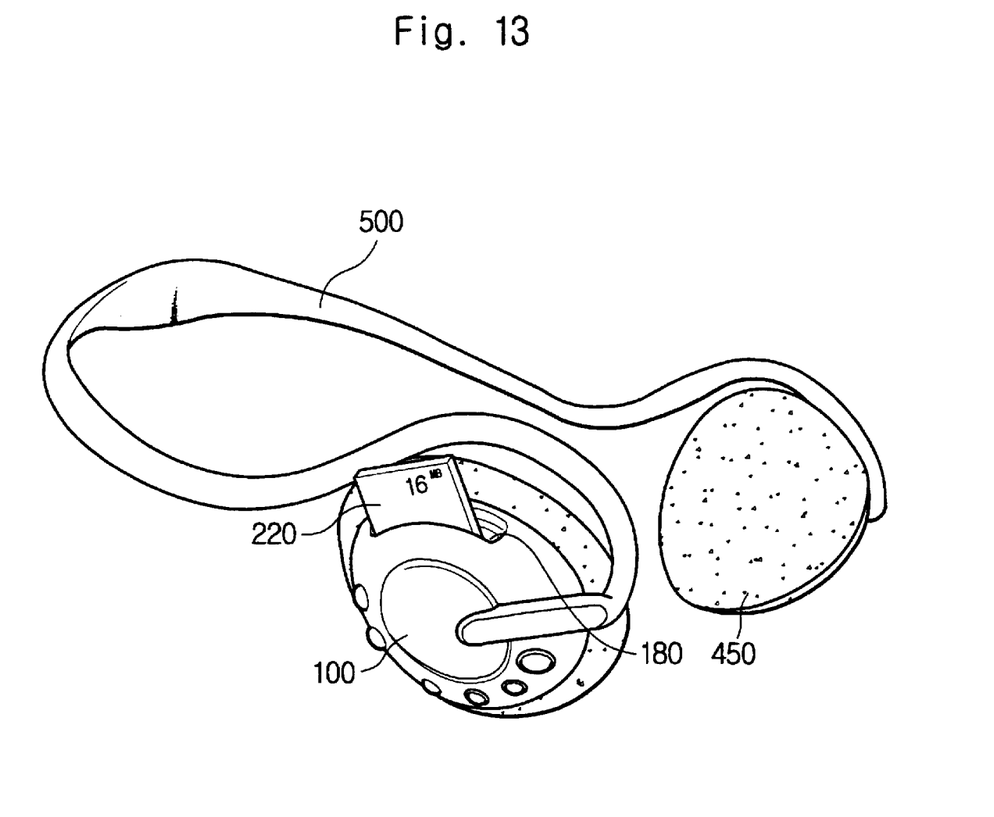
FIG. 13 is a perspective view showing a MP-3 player according to the other embodiment of the present invention.

According to the other embodiment of the present invention, as shown in FIG. 13, the memory card receiving portion 180 may be formed on the first housing 100 to be exposed to the outside, whereby the user can facilely replace the memory card 220. Further, the headband 500 may be mounted at the outer face of the first housing 100.

According to the MP-3 player of the present invention, the speaker portion and the main body are integrally formed into a headphone or back-phone type, thereby minimizing the size of the MP-3 player. Further, since a separate wire is not needed in the MP-3 player, thereby reducing the trouble such as a short of the wire.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. An MP-3 player, comprising:
    a first speaker portion in which a speaker is mounted and which is positioned at an ear of a user;
    an electric device portion which is mounted in the first speaker portion and provided with electric parts for reproducing a sound source of a MP-3 file;
    a second speaker portion in which a speaker is mounted and which is positioned at the other ear of the user;
    a wearing means for connecting the first speaker portion and the second speaker portion, which is worn on the user's head portion;
    and wherein the first speaker portion comprises a first housing in which a battery receiving portion is formed, a second housing which is coupled to a face of the first housing and in which the electric device portion is provided, and a third housing which is coupled to a face of the second housing in which the speaker is mounted.

2. The MP-3 Player according to claim 1 further comprising a cover which opens/closes the battery receiving portion of the first housing, and wherein the electric device portion is formed with a memory card supporting member, and an entrance of the memory card supporting member is formed in an inner portion of the battery receiving portion.

3. The MP-3 player according to claim 1, wherein the third housing is provided a protrusion which is projected toward the second housing and of which an end is a hook shaped portion, and the second housing has a slot to which the protrusion is fitted, wherein the slot comprises an inserting portion through which a protrusion of the third housing is inserted, and a coupling portion which is extended from the inserting portion and has narrower width than that of the inserting portion so that the hook shaped portion is latched to the coupling portion.

4. The MP-3 player according to claim 3, further comprising a stepped portion which is provided between the inserting portion and the coupling portion of the third housing so that the hooked shaped portion of the protrusion is not returned to the inserting portion.

5. The MP-3 player according to claim 1, wherein the second housing comprises a mounting groove in which a switch is disposed so as to be accessible from outside the first speaker portion.

6. The MP-3 player according to claim 1, wherein means is a headband of which one end is mounted to the first speaker portion and the other end is mounted to the second speaker portion.

7. The MP-3 player according to claim 6, further comprising a connecting member which connects an end of the headband and the first speaker portion and is provided with a fitting plate, and wherein the first and second housings are respectively provided with a fitting groove to which the fitting plate is mounted.

8. The MP-3 player according to claim 7, wherein the connecting member is formed with a through hole through which a wire extended from the first speaker portion is passed.

9. The MP-3 player according to claim 1, further comprising a radio receiver which is mounted in the second speaker portion.

* * * * *